United States Patent
Crete et al.

(10) Patent No.: US 10,510,942 B2
(45) Date of Patent: Dec. 17, 2019

(54) PROCESS FOR MANUFACTURING A JOSEPHSON JUNCTION AND ASSOCIATED JOSEPHSON JUNCTION

(71) Applicant: Thales, Neuilly sur Seine (FR)

(72) Inventors: Denis Crete, Palaiseau (FR); Bruno Marcilhac, Palaiseau (FR); Yves Lemaître, Palaiseau (FR)

(73) Assignee: Thales, Neuilly sur Seine (FR)

( * ) Notice: Subject to any disclaimer, the term of this patent is extended or adjusted under 35 U.S.C. 154(b) by 227 days.

(21) Appl. No.: 15/026,392

(22) PCT Filed: Sep. 30, 2014

(86) PCT No.: PCT/EP2014/070905
§ 371 (c)(1),
(2) Date: Apr. 29, 2016

(87) PCT Pub. No.: WO2015/049224
PCT Pub. Date: Apr. 9, 2015

(65) Prior Publication Data
US 2016/0233405 A1  Aug. 11, 2016

(30) Foreign Application Priority Data
Oct. 1, 2013 (FR) .................... 13 02280

(51) Int. Cl.
*H01L 39/22* (2006.01)
*H01L 39/24* (2006.01)

(52) U.S. Cl.
CPC ............ *H01L 39/225* (2013.01); *H01L 39/22* (2013.01); *H01L 39/223* (2013.01);
(Continued)

(58) Field of Classification Search
CPC ..... H01L 39/22; H01L 39/223; H01L 39/225; H01L 39/2467; H01L 39/2493; H01L 39/2496
See application file for complete search history.

(56) References Cited

U.S. PATENT DOCUMENTS 4,351,712 A * 9/1982 Cuomo ............. H01L 21/31683
204/192.34
5,051,396 A * 9/1991 Yamazaki ............. H01L 39/225
257/33
(Continued)

FOREIGN PATENT DOCUMENTS

JP     S5889875 A     5/1983

OTHER PUBLICATIONS

PCT International Search Report dated Mar. 12, 2014 issued in corresponding PCT International Application No. PCT/EP2014/070905.
(Continued)

*Primary Examiner* — Mohsen Ahmadi
*Assistant Examiner* — Christopher M Roland
(74) *Attorney, Agent, or Firm* — Troutman Sanders LLP

(57) ABSTRACT

The invention relates to a method for manufacturing a Josephson junction comprising a step for providing a substrate, extending along a longitudinal direction, a step for depositing a superconducting layer on the substrate so that this layer extends from the substrate in a transverse direction, perpendicular to the longitudinal direction, and a step for irradiation of ions in a central area of the layer defined in the longitudinal direction, the method being characterized in that it includes, prior to the irradiation step, a step for removing a portion of the central area of the superconducting layer so as to delimit a set of areas of the superconduct-
(Continued)

ing layer aligned in the longitudinal direction including the central area and two lateral areas.

9 Claims, 2 Drawing Sheets

(52) U.S. Cl.
CPC ...... *H01L 39/2467* (2013.01); *H01L 39/2493* (2013.01); *H01L 39/2496* (2013.01)

(56) References Cited

U.S. PATENT DOCUMENTS

| | | | | |
|---|---|---|---|---|
| 5,326,745 | A * | 7/1994 | Nishino | H01L 39/225 |
| | | | | 257/33 |
| 5,411,937 | A * | 5/1995 | Wendt | B82Y 10/00 |
| | | | | 216/3 |
| 5,506,197 | A * | 4/1996 | Nakamura | H01L 39/146 |
| | | | | 257/34 |
| 5,547,922 | A * | 8/1996 | Ma | H01L 39/2464 |
| | | | | 427/526 |
| 5,552,373 | A | 9/1996 | Agostinelli et al. | |
| 6,541,789 | B1 | 4/2003 | Sato et al. | |
| 2011/0193100 | A1* | 8/2011 | Tsuchiya | H01L 23/544 |
| | | | | 257/77 |

OTHER PUBLICATIONS

French Search Report dated Jun. 20, 2014 issued in corresponding French Application No. 1302280.

* cited by examiner

PROCESS FOR MANUFACTURING A JOSEPHSON JUNCTION AND ASSOCIATED JOSEPHSON JUNCTION

CROSS-REFERENCE TO RELATED APPLICATIONS

This application is the U.S. National Phase of International Patent Application Serial No. PCT/EP2014/070905, filed Sep. 30, 2014, which claims priority to French Patent Application No. 1302280, filed Oct. 1, 2013, both of which are herein incorporated by reference in their entireties.

FIELD OF THE INVENTION

The present invention relates to a method for manufacturing a Josephson junction. The invention also relates to a Josephson junction.

BACKGROUND

Superconducting components are used in many applications including the determination of magnetic susceptibilities of tiny samples on a wide temperature range. The detection of nuclear magnetic resonance and quadripolar resonance, the measurement of temperature by means of noise measurements (also called noise thermometry), biomagnetism, geophysics, magnetism of rocks or paleomagnetism.

For this, one makes use of the Josephson affect. By definition, the Josephson affect is made manifest by the occurrence of a current, also called a super-current, between two superconducting materials separated by a layer formed with an insulating or non-superconducting metal material. The assembly of both superconducting materials and the layer is called a "Josephson junction".

The occurrence of this current is explained by the macroscopic theory of superconductivity developed by John Bardeen, Leon Cooper and Robert Schrieffer. According to this theory, above the superconducting transition temperature, at least one portion of the free electrons in the superconducting material are bound together so as to form pairs of electrons so-called "Cooper pairs".

Super-conductivity is a macroscopic quantum phenomenon inducing order at a macroscopic scale, which has three main consequences: infinite electric conductivity of a superconducting ring justifying the existence of a permanent current of Cooper pairs, the quantification of the magnetic flux through a superconducting ring, resulting from the application of a magnetic field and of the current induced into the ring and the Josephson affect sometimes called a Josephson tunnel affect. In order to explain the latter phenomenon, let us consider two super-conductors separated by a thin insulating barrier through which the Cooper pairs may pass by a quantum tunnel affect, by maintaining the phase coherence between both super-conductors during the method. Josephson showed that the difference $\delta$ between the phases of the wave functions on both sides of the Josephson junction is in relationship with a super-current I circulating through the barrier and at the voltage V on the terminals of the Josephson junction by the following relationship:

$$\left\{ \begin{array}{l} \sin\delta = \dfrac{I}{I_C} \\ V = \dfrac{\Phi_0}{2\pi} \dfrac{\partial \delta}{\partial t} \end{array} \right\}$$

Wherein:
$I_C$ is the critical current, which is the maximum supercurrent which the Josephson junction may support; this critical current is related to the transparency of the barrier and to the Cooper pair density in the Josephson junction, and
$\Phi_0$ is the flux quantum, which is the ratio between Planck's constant and the charge of a Cooper pair.

In a Josephson junction, the current of Cooper pairs contributes to electron transport, but in parallel, there conventionally exists the current of lone electrons («quasiparticles») associated with a dissipative term characterized by a resistance $R_n$. From this results a differential equation of the first order in $\delta$, which may be analytically solved for obtaining the time-dependent change in $\delta$, which gives after a time average, the following equation:

$$\langle V \rangle = \dfrac{\Phi_0}{2\pi} \left\langle \dfrac{\partial \delta}{\partial t} \right\rangle = V_C \sqrt{I^2 - I_C^2}$$

Wherein $V_C = R_n \cdot I_C$ is the characteristic voltage of the Josephson junction.

It is desirable to propose arrangements of superconducting components giving the possibility of benefitting from this property like superconducting loops comprising a quantum interference superconducting device, most often designated under the acronym of SQUID, which refers to "Superconducting Quantum Interference Device". Such a SQUID is a superconducting loop provided with one (respectively two) Josephson junction(s) operating with a radiofrequency current (respectively a direct current). Obtaining that the thickness of the superconducting loop of a super-conductor circuit should be high, in order to obtain a low inductance while having a thin Josephson junction thickness so that the normal resistance is high.

From the state of the art, it is thus known how to make relatively complex superconducting circuits in two dimensions by producing the Josephson junction barrier by localized irradiation of oxygen or fluorine ions.

A low dose of irradiation gives the possibility of obtaining a Josephson junction which may operate at a temperature of the order of 70 K (Kelvins), but having a low normal resistance (a few tens of Ohms). Such a resistance is generally considered to be too small.

A strong dose of irradiation or an increase in the thickness of the barrier gives the possibility of increasing the resistance of the Josephson junction. However, this imposes operation at lower temperatures, for example between 30 and 40 K, which is a constraint.

SUMMARY

Therefore, a need exists for a manufacturing method giving the possibility of obtaining a Josephson junction operating at a large normal resistance at a relatively high temperature. For this purpose, the invention proposes a method for manufacturing a Josephson junction comprising:
- a step for providing a substrate, extending along a first direction, a so-called longitudinal direction,
- a step for depositing a superconducting layer on the substrate so that this layer extends from the substrate in a second direction, a so-called transverse direction, perpendicular to the longitudinal direction, and
- a step for irradiation of ions in a central area of the layer defined in the longitudinal direction, the method being characterized in that the method includes, prior to the irradiation step:
a step for removing a portion of the central area of the superconducting layer so as to delimit a set of areas of the superconducting layer aligned in the longitudinal direction including the central area and two lateral areas, the central area being positioned between both lateral areas and having a dimension in the transverse direction smaller than the dimension of each lateral area in this same transverse direction.

According to particular embodiments, the method comprises one or several of the following features, taken individually or according to all the technically possible combinations:
the removal step is applied by producing a lithographic pattern in the superconducting layer;
the superconducting layer is formed with at least one upper layer and one lower layer in contact with the substrate, each upper layer and the lower layer being stacked along the transverse direction, and each made in a distinct superconducting material, the removal step being applied so as to substantially retain the lower layer in the central area;
the irradiation step comprises a plurality of irradiation sub-steps, each irradiation sub-step being applied at a distinct energy so as to obtain a succession of insulating areas in the central area along the transverse direction;
the removal step and the irradiation step are applied by using a same lithographic mask;

Further, the invention also relates to a method for manufacturing a Josephson junction comprising:
a step for providing a substrate, extending along a first direction, a so-called longitudinal direction,
a step for depositing a superconducting layer on the substrate so that this layer extends from the substrate in a second direction, a so-called transverse direction, perpendicular to the longitudinal direction, and
an irradiation step of ions in a central area of the layer defined in the longitudinal direction,
the method being characterized in that the method includes a step for irradiation of ions in the central area of the superconducting layer so as to form two areas aligned along the transverse direction, one of the two areas being in an insulating material and the other area in a conductive material, and so as to delimit a set of areas of the superconducting layer aligned in the longitudinal direction including the central area and two lateral areas, the central area being positioned between both lateral areas, the area in a conductive material of the central area having a dimension in the transverse direction smaller than the dimension of each lateral area in this same transverse direction.

Further, the invention also relates to a Josephson junction comprising:
a substrate extending along a first direction, a so-called longitudinal direction,
a superconducting layer positioned on the substrate, extending from the substrate in a second direction, a so-called transverse direction, and including a set of areas aligned in the longitudinal direction, comprising:
a first superconducting lateral area formed with at least one superconducting material and extending along the transverse direction,
a second superconducting lateral area formed with at least one superconducting material and extending along the transverse direction, and
a central area forming a barrier positioned between the first superconducting lateral area and the second superconducting lateral area in the longitudinal direction, the central area having a dimension in the transverse direction smaller than the dimension of each lateral area in this same transverse direction.

According to particular embodiments, the junction comprises one or several of the following features, taken individually or according to all the technically possible combinations:
the central area has a dimension in the transverse direction of less than 100 nm.

Further, the invention also relates to a Josephson junction comprising:
a substrate extending along a first direction, a so-called longitudinal direction,
a superconducting layer positioned on the substrate, extending from the substrate in a second direction, a so-called transverse direction, and including a set of areas aligned in the longitudinal direction, comprising:
a first superconducting lateral area formed with at least one superconducting material and extending along the transverse direction,
a superconducting second lateral area formed with at least one superconducting material and extending along the transverse direction, and
a central area forming a barrier positioned between the first superconducting lateral area and the second superconducting lateral area in the longitudinal direction, the central area including two areas aligned along the transverse direction, one of the two areas in an insulating material and the other area in a non-superconducting material, the non-superconducting material area of the central area having a dimension in the transverse direction smaller than the dimension of each lateral area in this same transverse direction and allowing electron transport between both lateral areas.

BRIEF DESCRIPTION OF THE DRAWINGS

Other features and advantages of the invention will become apparent upon reading the detailed description which follows of embodiments of the invention, given only as an example and with reference to the drawings wherein.

DETAILED DESCRIPTION

Figure 1:
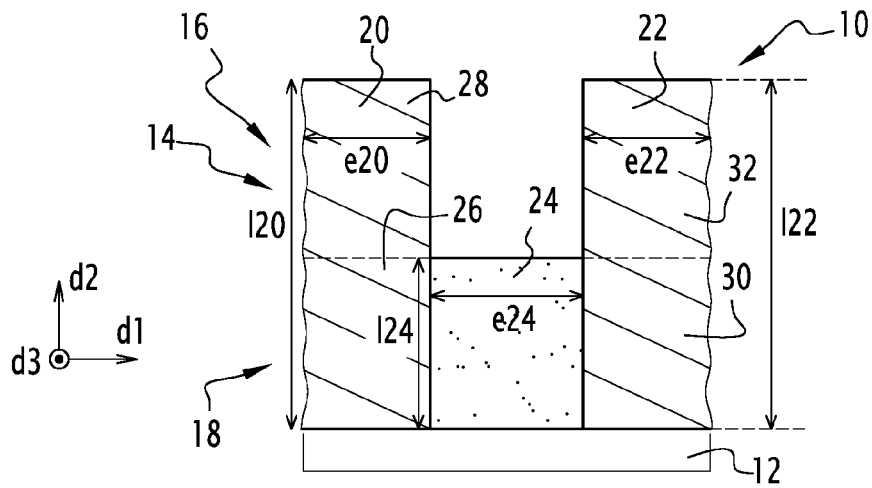
FIG. 1 is a schematic sectional view of a Josephson junction according to an example of the invention.

A Josephson junction 10 is illustrated in FIG. 1.
The Josephson junction 10 includes a substrate 12 extending along a first direction, a so-called longitudinal direction d1 and a superconducting layer 14 positioned on the substrate 12. The longitudinal direction d1 is defined by the transport direction of the electron current in the Josephson junction 10 during operation.
The substrate 12 is formed with a material compatible with the superconducting material of the superconducting layer 14. The materials of the substrate 12 are generally selected for their structural properties (lattice parameter), chemical properties (low reactivity relatively to the superconductor) and electromagnetic properties (dielectric constant depending on the applications, but generally with low losses). As an example, the material forming the substrate 12 is $SrTiO_3$, $LaAlO_3$, $MgO$, $Al_2O_3$ or $NdGaO_3$. The superconducting layer 14 is formed with an upper layer 16 and a lower layer 18 in contact with the substrate 12. The upper layer 16 and the lower layer 18 are stacked along a second direction, a so-called transverse direction d2 perpendicular to the longitudinal direction d1.

Preferably, the superconducting layer 14 is sufficiently thick so as to be considered as a superconducting film. Typically, a superconducting film in a material with a given elementary lattice cell height has a thickness greater than three times the height of the elementary lattice cell.

In the described example, the upper layer 16 is in a first superconducting material S1 while the lower layer 18 is in a second superconducting material S2 distinct from the first material S1. According to an alternative, both superconducting materials S1 and S2 are identical.

Preferably, the superconducting materials S1 and S2 are superconducting materials with a so-called "high critical temperature", i.e. super-conductors for which the critical temperature is greater than 30K or 40 K according to the currently recognized definitions. As an example, the superconducting materials S1 and S2 are mixed oxides of barium, copper and yttrium (chemical formula YBaCuO or YBCO), mixed oxides of barium, copper and neodymium (chemical formula NdBaCuO or NdBCO) or mixed oxides of barium, copper and dysprosium (chemical formula DyBaCuO or DyBCO). Preferably, the super-conductor is non-metal and in particular of the ceramic type based on copper oxide (ReBaCuO, wherein Re represents a chemical element of the rare earth type).

Alternatively, the superconducting layer 14 includes a plurality of upper layers made in distinct superconducting materials instead of one single upper layer 16.

The superconducting layer 14 comprises a first superconducting lateral area 20, a second superconducting lateral area 22 and a central area 24 forming a barrier.

The first superconducting lateral area 20 includes a lower portion 26 formed in the second superconducting material S2 and an upper portion 28 formed in the first superconducting material S1. The separation between the lower portion 26 and the upper portion 28 is materialized in FIG. 1 by dotted lines. The first lateral area 20 extends from the substrate 12 along the transverse direction d2.

The first lateral area 20 has a dimension e20 along the longitudinal direction d1.

The first lateral area 20 has a dimension l20 along the transverse direction d2 preferably comprised between 300 nm and 500 nm.

The first lateral area 20 has a dimension along a third direction d3 (perpendicular to the longitudinal direction d1 and perpendicular to the transverse direction d2) preferably comprise between 0.2 micrometer (μm) and 5 μm. Advantageously, the first lateral area 20 has a dimension of 1 μm along the third direction d3. It should be noted that the substrate 12 also extends along the third direction d3.

The second superconducting lateral area 22 includes a lower portion 30 formed in the second superconducting material S2 and an upper portion 32 formed in the first superconducting material S1. The separation between the lower portion 30 and the upper portion 32 is materialized in FIG. 1 by dotted lines. The second lateral area 22 extends from the substrate 12 along the transverse direction d2.

The second lateral area 22 has a dimension e22 along the longitudinal direction d1.

The second lateral area 22 has a dimension l22 along the transverse direction d2 preferably comprised between 300 nm and 500 nm. The dimension l22 along the transverse direction d2 is generally equal to the dimension l20 along the transverse direction d2 of the first lateral area 20, in particular when the method for growing the super-conductor used for obtaining the superconducting layer 14 produces a sufficiently homogenous thin film.

The second lateral area 22 has a dimension along the third direction d3 preferably comprised between 0.2 μm and 5 μm. Advantageously, the second lateral area 22 has a dimension of 1 μm along the third direction d3.

According to the example of FIG. 1, the second lateral area 22 substantially has the same dimensions as the first lateral area 20.

The central area 24 is positioned between the first superconducting lateral area 20 and the second superconducting lateral area 22 in the longitudinal direction d1.

The central area 24 is formed in a material, for which the superconducting properties are attenuated relatively to the superconducting materials of the first lateral area 20

The central area 24 is formed in a material, for which the superconducting properties are attenuated relatively to the superconducting materials of the first lateral area 20 and of the second lateral area 22. As an example, the material of the central area 24 has a critical temperature below that of the superconducting materials of the first lateral area 20 and of the second lateral area 22. The thereby attained goal is to make the central area 24 as insulating as possible for both lateral areas 20, 22, which optimizes the Josephson affect.

Alternatively, the central area 24 is formed in a non-superconducting material.

The central area 24 has a dimension e24 along the longitudinal direction d1 allowing the existence of a Josephson affect between both lateral areas 20, 22. Thus, the dimension e24 along the longitudinal direction d1 of the central area 24 depends on the material of the central area 24, and is preferably less than 100 nm, for example 20 nm, 40 nm or 80 nm, for the YBCO irradiated with oxygen ions.

The central area 24 has a dimension l24 along the transverse direction d2 smaller than the dimension l20, l22 along the transverse direction d2 of each lateral area 20, 22.

Advantageously, the dimension l24 along the transverse direction d2 is selected as the smallest dimension not altering the properties of electron and Cooper pair transfer in the Josephson junction 10.

For this, for example, the dimension l24 of the central area 24 along the transverse direction d2 is less than 60% of the dimension l20, l22 of each lateral area 20, 22 along the transverse direction d2, preferably less than 30%, preferentially than 10%.

For example, the dimension l24 of the central area 24 along the transverse direction d2 of the central area 24 is comprised between 50 nm and 100 nm.

The central area 24 has a dimension along the third direction d3 preferably comprised between 0.2 μm and 5 μm. Preferably, the central area 24 has a dimension of 1 μm along the third direction d3, i.e. a dimension equal to the dimensions of the first lateral area 20 and of the second lateral area 22 along the third direction d3.

The operation of the Josephson junction 10 is similar to the operation of a traditional Josephson junction. It is not therefore specifically described within the scope of this description.

The Josephson junction 10 of FIG. 1 has a central area 24 forming a barrier having a dimension l24 along the reduced transverse direction d2. The section perpendicular to the current lines covering the Josephson junction is therefore reduced. Therefore, like the value of the normal resistance of the Josephson junction 10 is inversely proportional to the section perpendicular to the lines of current, the value of the normal resistance is increased.

This increase in the normal resistance is obtained without modifying the operating temperature of the superconducting materials S1, S2 of the lateral areas 20, 22. Consequently, the Josephson junction 10 of FIG. 1 is able to operate at temperatures comprised between 40 K and 80 K.

Figure 2:
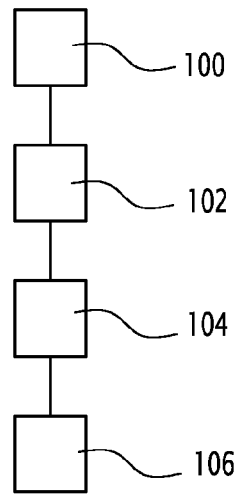
FIG. 2 is a flow chart illustrating the steps of an exemplary method for manufacturing a Josephson junction according to the invention.

Further, such a Josephson junction is easy to manufacture as illustrated by the manufacturing method described with reference to the flow chart of FIG. 2 which shows an exemplary embodiment of a method for manufacturing a Josephson junction 10 according to the invention.

The method for manufacturing a Josephson junction 10 comprises a step 100 for providing the substrate 12, extending along a first direction, a so-called longitudinal direction d1.

The method then includes a step 102 for depositing a superconducting layer 14 on the substrate 12 giving the possibility of obtaining a first assembly.

The deposition step 102 is for example applied by a technique known per se of chemical vapor phase deposition (often called CVD for Chemical Vapor Deposition) or a physical vapor phase deposition (often called PVD for Physical Vapor Deposition). As an example, the deposition step 102 is applied by cathode sputtering, by co-evaporation or by ablation by means of a pulsed source laser.

The method then includes a step for generally outlining the first assembly, defining the extension of the first assembly along the third direction d3, which will not be described since it is known to one skilled in the art.

The method then comprises a step 104 for removing a portion of the central area 24 of the superconducting layer 14 so as to delimit an assembly of areas of the superconducting layer 14 in the longitudinal direction d1 including the central area 24 and the two lateral areas 20, 22 such as the central area 24 is positioned between both lateral areas 20, 22 and has a dimension l24 along the transverse direction d2 smaller than the dimension l20, l22 along the transverse direction d2 of each lateral area 20, 22.

According to the illustrated example, the removal step 104 is applied by producing a lithographic pattern in the superconducting layer 14. In this case, use is made of a lithographic mask onto which is sent a beam of ions, having an energy usually of less than one keV (kilo electron-volt), leading to the erosion of the superconducting material S1 of the upper layer 16. The lithographic mask is for example formed in a polymeric material. Any other method for removing material may be contemplated. As an example, chemical etching or etching with plasma may be used.

The removal step 104 is applied so as to retain at least the lower layer 18 in the central area 24.

For example, the removal step 104 is stopped when a change in the superconducting material is detected, in which lithographic etching is applied. More specifically, in the case of the example shown, when the presence of the second superconducting material S2 is detected.

Such detection is as an example, applied by applying a mass spectrometry technique with secondary ionization. Secondary ionization mass spectrometry is a surface analysis method known under the acronym of SIMS referring to "Secondary Ion Mass Spectrometry". According to this method, the surface of the sample to be analyzed is bombarded with an ion beam, which sprays and ionizes a portion of the material of the surface. These secondary ions are then accelerated towards a mass spectrometer which will give the possibility of measuring the elementary, isotopic or molecular composition of the surface of the sample.

The method then comprises a step 106 for irradiation of ions in the central area 24 of the layer defined in the longitudinal direction d1.

At this irradiation step 106, for example use is made of the same lithographic mask as the mask used in the removal step 104. This gives the possibility of irradiating the central area 24 which has been subject to removal with good alignment (the mask is not displaced between the removal step 104 and the irradiation step 106).

The irradiation is accomplished by bombardment of ions at an energy of about 100 keV for the ions being implanted into the superconducting material S2 of the lower layer 18.

Further, the irradiated ions in the irradiation step 106 are ions selected so as to be implanted into a superconducting material so as to lower its critical temperature. As an example, the irradiated ions are oxygen, fluorine or argon ions.

Figure 3:
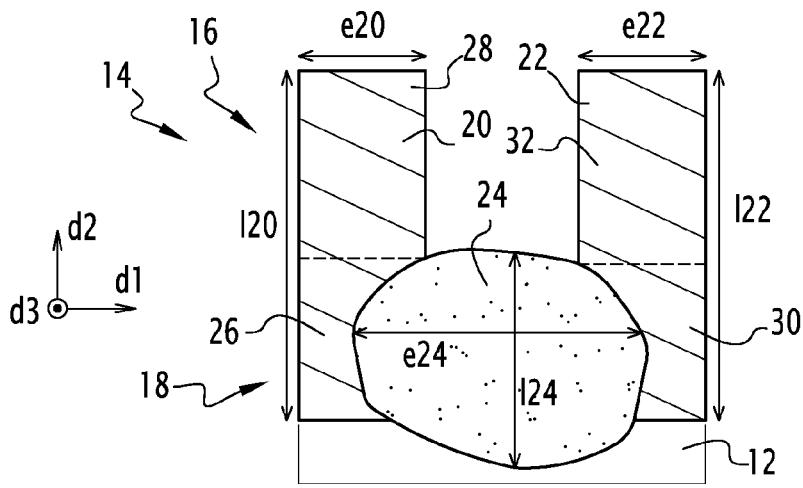
FIG. 3 is a schematic sectional view of the junction obtained at the end of the application of the method according to FIG. 2.

The manufacturing method gives the possibility of obtaining the Josephson junction 10 of FIG. 3. The Josephson junction 10 of FIG. 3 has a central area 24 forming a barrier having a reduced dimension l24 along the transverse direction d2. The section perpendicular to the lines of current intended to cover the Josephson junction is therefore reduced. Consequently, as the value of the normal resistance of the Josephson junction 10 is inversely proportional to the section perpendicular to the lines of current, the value of the normal resistance is increased.

This increase in the normal resistance is obtained without increasing the dimension e24 along the longitudinal direction d1 of the central area 24. Consequently, the Josephson junction 10 of FIG. 3 is able to operate at temperatures comprised between 40K and 80K.

Further, the method gives the possibility of obtaining portions of the first lateral area 20 and of the second lateral area 24 not affected by irradiation of ions. Simulations have actually shown very clear preferential localization of the defects induced by the irradiation of an ion beam on the portion of the superconducting layer which is found facing the ion beam.

In this case, the portions not modified by the introduction of defects are the lower portions 28, 32 of the first lateral area 20 and of the second lateral area 24. Thus, the supercurrent generated during operation of the Josephson junction 10 accesses the central area 24 by passing through the upper portions 28, 32. The behavior of the Josephson junction 10 is, consequently closer to the expected theoretical behavior than in the case of a Josephson junction obtained by applying a manufacturing method according to the state of the art.

It should be noted that the Josephson junction 10 of FIG. 3 has a so-called "pear" affect at the central area 24, i.e. certain portions of the lateral areas 20, 22 are degraded by the irradiation of ions. Because of this "pear" affect, the dimension of the degraded area is greater than the dimension e24 along the longitudinal direction d1 of the central area 24 and is of the order of 100 nm. However, in practice, as the current in the Josephson junction circumvents the degraded portions before passing through the central area 24, the effective dimension along the longitudinal direction d1 of the central area 24 seen by the current is equal to the dimension e24 along the longitudinal direction d1 of the Josephson junction 10 illustrated in FIG. 1.

An application of such a Josephson junction 10 notably relates to the making of a SQUID having better sensitivity to the magnetic field. This is obtained by means of a relatively small loop inductance (resulting from a section of the highly superconducting layer perpendicular to the longitudinal direction d1) and of a higher normal resistance (because of the dimension l24 along the reduced longitudinal direction d2 of the central area 24). Such a loop may be used for example in the architecture of the elements (often designated as "front-ends") connected to the antenna on devices intended for electronic warfare, in the field of communications, in the field of RADARs or for the processing of the digital or analogue signal.

According to an alternative, the irradiated ions are ions different from oxygen like fluorine or argon ions.

According to still another alternative, the step 106 for irradiation of ions comprises a plurality of irradiation sub-steps, each irradiation sub-step being applied at an energy distinct from those of the other sub-steps so as to obtain good homogeneity of the central area 24 along the second direction d2.

According to another alternative, the step 106 for irradiation of ions comprises a plurality of irradiation sub-steps, each irradiation sub-step being applied with distinct ions so as to obtain good homogeneity of the central area 24 along the second direction d2.

Figure 4:
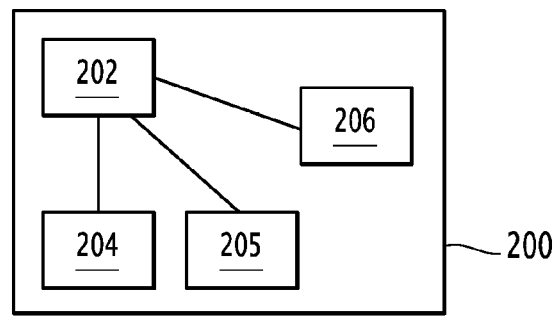
FIG. 4 is a diagram of an exemplary device for manufacturing a Josephson junction according to the invention.

The method is applied by a device 200 for manufacturing a Josephson junction as illustrated in FIG. 4. The device 200 comprises a deposition unit 202, an electronic lithographic unit 204, an etching unit 205 and an ion irradiation unit 206.

The deposition unit 202 is able to deposit the superconducting layer 14 on the substrate 12.

The electronic lithographic unit 204 is able to transferring the given pattern of a lithographic mask onto the layer used as an etching mask.

The etching unit 205 is able to remove a portion of the central area 24 of the superconducting layer 14 so as to delimit an assembly of areas of the superconducting layer 14 in the longitudinal direction d1 having the central area 24 and the two lateral areas 22, 24 for applying the removal step 104.

The ion irradiation unit 206 is able to apply the step 106 for irradiation of ions. The ion irradiation unit 206 is often designated as "implanter".

According to a particular embodiment, the electronic lithographic units 204, etching units 205 and ion irradiation units 206 coincide.

Figure 5:
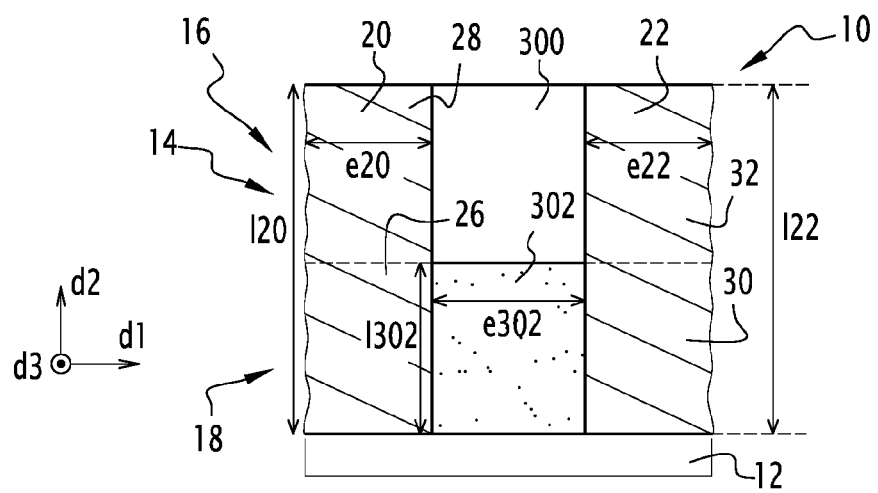
FIG. 5 is a schematic sectional view of a Josephson junction according to another example of the invention.

FIG. 5 illustrates a second embodiment for the Josephson junction 10. The elements identical with the first embodiment are not repeated, only the differences are emphasized.

The central area 24 further includes an insulating area 300 and a non-superconducting area 302 superposed along the direction d2.

The non-superconducting area 302 of the central area 24 has a dimension e302 along the longitudinal direction d1 allowing the existence of a Josephson effect between both lateral areas 20, 22. Thus, the dimension e302 along the longitudinal direction d1 of the central area 24 is preferably less than 100 nm, for example 20 nm, 40 nm or 80 nm.

The non-superconducting area 302 of the central area 24 has a dimension l302 along the transverse direction d2 smaller than the dimension l20, l22 along the transverse direction d2 of each lateral area 20, 22. Advantageously, the dimension l302 along the transverse direction d2 is selected from the smallest dimension which does not alter the transfer properties for electrons and Cooper pairs in the Josephson junction 10.

For this, for example, the dimension l302 of the non-superconducting area 302 of the central area 24 along the transverse direction d2 is less than 60% of the dimension l20, l22 of each lateral area 20, 22 along the transverse direction d2, preferably less than 30%, preferentially less than 10%.

For example, the dimension l302 along the transverse direction d2 of the non-superconducting area 302 of the central area 24 is comprised between 50 nm and 100 nm.

The insulating area 300 is positioned between the first superconducting lateral area 20 and the second superconducting lateral area 22 in the longitudinal direction d1. The insulating area 300 is positioned on the central area 24.

The insulating area 300 is formed in an insulating material.

Consequently, the properties of the Josephson junction 10 according to the first embodiment are the same as those of the Josephson junction 10 according to the second embodiment.

However, the proposed manufacturing method differs in that instead of applying a step 104 for removing the central area 24 of the superconducting layer 14, a step for irradiation of ions in the central area 24 of the superconducting layer 14 is applied so as to form two areas 300, 302 aligned along the transverse direction d2, one area 300 being in an insulating material and one area 302 being in a conducting material. Further, this irradiation step gives the possibility of delimiting in the superconducting layer 14 both lateral areas 20, 22 and the central area 24.

Preferably, the ions are ions for which one of the elements is of an atomic number greater than or equal to 27. Advantageously, the element is a transition metal. For example, the element is cobalt.

The invention claimed is:

1. A method for manufacturing a Josephson junction comprising:
   providing a substrate, extending along a first direction, a longitudinal direction,
   depositing a superconducting layer on the substrate so that the layer extends from the substrate in a second direction, a transverse direction, perpendicular to the longitudinal direction,
   a first irradiation of ions in a central area of the superconducting layer so as to form two areas aligned along the transverse direction, one of both areas being in an insulating material and the other area in a conducting material, and so as to delimit a set of areas of the superconducting layer aligned in the longitudinal direction including the central area and two lateral areas, the central area being positioned between both lateral areas, the area in a conducting material of the central area having a dimension in the transverse direction smaller than the dimension of each lateral area in this same transverse direction, wherein each ion used at the first irradiation of ions is an ion of an element that is a transition metal, and then
   a second irradiation of ions in a central area of the layer defined in the longitudinal direction.

2. A Josephson junction comprising:
   a substrate extending along a first direction, a longitudinal direction, a superconducting layer positioned on the substrate, extending from the substrate in a second direction, a transverse direction, and including a set of areas aligned in the longitudinal direction, comprising:
  a first superconducting lateral area formed with at least one superconducting material and extending along the transverse direction,
  a second superconducting lateral area formed with at least one superconducting material and extending along the transverse direction, and
  a central area forming a barrier positioned between the first superconducting lateral area and the second superconducting lateral area in the longitudinal direction, the central area having a dimension in the transverse direction smaller than the dimension of each lateral area in this same transverse direction, and having a ratio between the dimension of the central area having a dimension in the transverse direction and the dimension of each lateral area in this same transverse direction of less than 60%,
wherein the Josephson junction is manufactured by a method comprising:
  removing a portion of a central area of the superconducting layer defined in the longitudinal direction, so as to delimit the set of areas of the superconducting layer aligned in the longitudinal direction including the central area and two lateral areas, the central area of the superconducting layer being positioned between both lateral areas and having a dimension in the transverse direction smaller than the dimension of each lateral area in this same transverse direction, the removing comprising using a lithographic mask onto which is sent a beam of ions; and then
  irradiation of ions in the central area of the superconducting layer defined in the longitudinal direction, and
wherein the removing and the irradiation are applied by using the lithographic mask.

3. The Josephson junction according to claim 2, wherein the central area dimension in the transverse direction is less than 100 nm.

4. The Josephson junction according to claim 2, wherein the ratio between the dimension of the central area having a dimension in the transverse direction and the dimension of each lateral area in this same transverse direction is less than 30%.

5. The Josephson junction according to claim 2, wherein the ratio between the dimension of the central area having a dimension in the transverse direction and the dimension of each lateral area in this same transverse direction is less than 10%.

6. A Josephson junction comprising:
a substrate extending along a first direction, a longitudinal direction,
a superconducting layer positioned on the substrate, extending from the substrate in a second direction, a transverse direction, and including a set of areas aligned in the longitudinal direction, comprising:
  a first superconducting lateral area formed with at least one superconducting material and extending along the transverse direction,
  a second superconducting lateral area formed with at least one superconducting material and extending along the transverse direction, and
  a central area forming a barrier positioned between the first superconducting lateral area and the second superconducting lateral area in the longitudinal direction, the central area including two areas aligned along the transverse direction, one of both areas being in an insulating material and the other area in a non-superconducting material, the area in a non-superconducting material of the central area having a dimension in the transverse direction smaller than the dimension of each lateral area in this same transverse direction and allowing electron transport between both lateral areas, and having a ratio between the dimension of the central area having a dimension in the transverse direction and the dimension of each lateral area in this same transverse direction of less than 60%,
wherein the Josephson junction is manufactured by a method comprising:
  a first irradiation of ions in a central area of the superconducting layer so as to form two areas aligned along the transverse direction, one of both areas being in an insulating material and the other area in a conducting material, and so as to delimit a set of areas of the superconducting layer aligned in the longitudinal direction including the central area and two lateral areas, the central area being positioned between both lateral areas, the area in a conducting material of the central area having a dimension in the transverse direction smaller than the dimension of each lateral area in this same transverse direction, wherein each ion used at the first irradiation is an ion of an element that is a transition metal, and then,
  a second irradiation of ions in a central area of the layer defined in the longitudinal direction.

7. The Josephson junction according to claim 6, wherein the ratio between the dimension of the central area having a dimension in the transverse direction and the dimension of each lateral area in this same transverse direction is less than 30%.

8. The Josephson junction according to claim 6, wherein the ratio between the dimension of the central area having a dimension in the transverse direction and the dimension of each lateral area in this same transverse direction is less than 10%.

9. A method for manufacturing a Josephson junction comprising:
providing a substrate, extending along a first direction, a longitudinal direction;
depositing a superconducting layer on the substrate so that this layer extends from the substrate in a second direction, a transverse direction, and including a set of areas aligned in the longitudinal direction, comprising:
  a first superconducting lateral area formed with at least one superconducting material and extending along the transverse direction,
  a second superconducting lateral area formed with at least one superconducting material and extending along the transverse direction, and
  a central area forming a barrier positioned between the first superconducting lateral area and the second superconducting lateral area in the longitudinal direction, the central area having a dimension in the transverse direction smaller than the dimension of each lateral area in this same transverse direction, and having a ratio between the dimension of the central area having a dimension in the transverse direction and the dimension of each lateral area in this same transverse direction of less than 60%;

removing, using a lithographic mask onto which is sent a beam of ions, a portion of the central area of the superconducting layer defined in the longitudinal direction, so as to delimit the set of areas of the superconducting layer aligned in the longitudinal direction including the central area and two lateral areas, the central area of the superconducting layer being positioned between both lateral areas and having a dimension in the transverse direction smaller than the dimension of each lateral area in this same transverse direction; and irradiation of ions, using the lithographic mask, in the central area of the superconducting layer defined in the longitudinal direction.

\* \* \* \* \*